United States Patent
Lee et al.

(10) Patent No.: US 8,252,684 B1
(45) Date of Patent: Aug. 28, 2012

(54) METHOD OF FORMING A TRENCH BY A SILICON-CONTAINING MASK

(75) Inventors: Hsiu-Chun Lee, Taipei (TW); Yi-Nan Chen, Taipei (TW); Hsien-Wen Liu, Taoyuan County (TW)

(73) Assignee: Nanya Technology Corp., Kueishan, Tao-Yuan Hsien (TW)

( * ) Notice: Subject to any disclaimer, the term of this patent is extended or adjusted under 35 U.S.C. 154(b) by 0 days.

(21) Appl. No.: 13/118,480

(22) Filed: May 30, 2011

(51) Int. Cl.
*H01L 21/44* (2006.01)
*H01L 21/302* (2006.01)
*H01L 21/461* (2006.01)

(52) U.S. Cl. .......... 438/675; 438/738; 438/740

(58) Field of Classification Search .......... None
See application file for complete search history.

(56) References Cited

U.S. PATENT DOCUMENTS

| | | | | |
|---|---|---|---|---|
| 5,739,059 | A * | 4/1998 | Chen et al. | 438/238 |
| 6,287,961 | B1 * | 9/2001 | Liu et al. | 438/638 |
| 6,506,674 | B2 * | 1/2003 | Ikeda et al. | 438/637 |
| 7,250,336 | B2 * | 7/2007 | Regul et al. | 438/243 |
| 7,553,723 | B2 * | 6/2009 | Huang | 438/246 |
| 7,588,996 | B2 * | 9/2009 | Yoon et al. | 438/444 |
| 8,092,703 | B2 * | 1/2012 | Ishibashi et al. | 216/41 |
| 8,110,475 | B2 * | 2/2012 | Chou | 438/386 |
| 2003/0045119 | A1 * | 3/2003 | Wang et al. | 438/745 |

* cited by examiner

*Primary Examiner* — Charles Garber
*Assistant Examiner* — Evren Seven
(74) *Attorney, Agent, or Firm* — Winston Hsu; Scott Margo

(57) ABSTRACT

A method of forming a trench by a silicon-containing mask is provided in the present invention. The method includes providing a substrate covered with a silicon-containing mask. Then, anti-etch dopants are implanted into the silicon-containing mask to transform the silicon-containing mask into an etching resist mask. Later, the substrate and the etching resist mask are patterned to form at least one trench. Next, a silicon-containing layer is formed to fill into the trench. Finally, the silicon-containing layer is etched by taking the etching resist mask as a mask.

7 Claims, 9 Drawing Sheets

METHOD OF FORMING A TRENCH BY A SILICON-CONTAINING MASK

BACKGROUND OF THE INVENTION

1. Field of the Invention

The invention relates to a method of forming a trench, and in particular to a method of forming a trench by a silicon-containing mask.

2. Description of the Prior Art

Integrated circuits are manufactured as assemblies of various devices. In the further development of modern semiconductor technologies, trench structure semiconductor devices or components with a trench structure are also increasingly being used. For example, deep trench isolation structures are employed in conventional systems, and are commonly used in order to reduce the total device area and provide good isolation between elements. Furthermore, interconnections are often made by means of contact plugs. The contact plugs is formed through filling the trenches with a metal or other conductive material to connect the individual devices. Other example of trench structure semiconductor devices may include trench gates, or trench capacitors.

FIG. 1 to FIG. 2 are schematic diagrams showing a conventional method of forming a trench. As shown in FIG. 1, a substrate 10 is covered by a pad oxide 12 and a patterned silicon nitride mask 14. Please refer to FIG. 2, numerous trenches 16 are formed by taking the patterned silicon nitride mask 14 as a mask. However, because the etching rate between silicon nitride and silicon oxide are different, a recess 18 may be formed in the pad oxide 12, and the sidewall of the trenches 16 becomes uneven.

SUMMARY OF THE INVENTION

The present invention aims at providing a novel method of forming a trench. The method utilizes the silicon-containing mask as a mask.

According to one aspect of the invention, a method of forming a trench by a silicon-containing mask includes providing a substrate covered with a silicon-containing mask. Then, anti-etch dopants are implanted into the silicon-containing mask to transform the silicon-containing mask into an etching resist mask. Later, the substrate and the etching resist mask are patterned to form at least one trench. Next, a silicon-containing layer is formed to fill into the trench. Finally, the silicon-containing layer is etched by taking the etching resist mask as a mask.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

Figure 1:
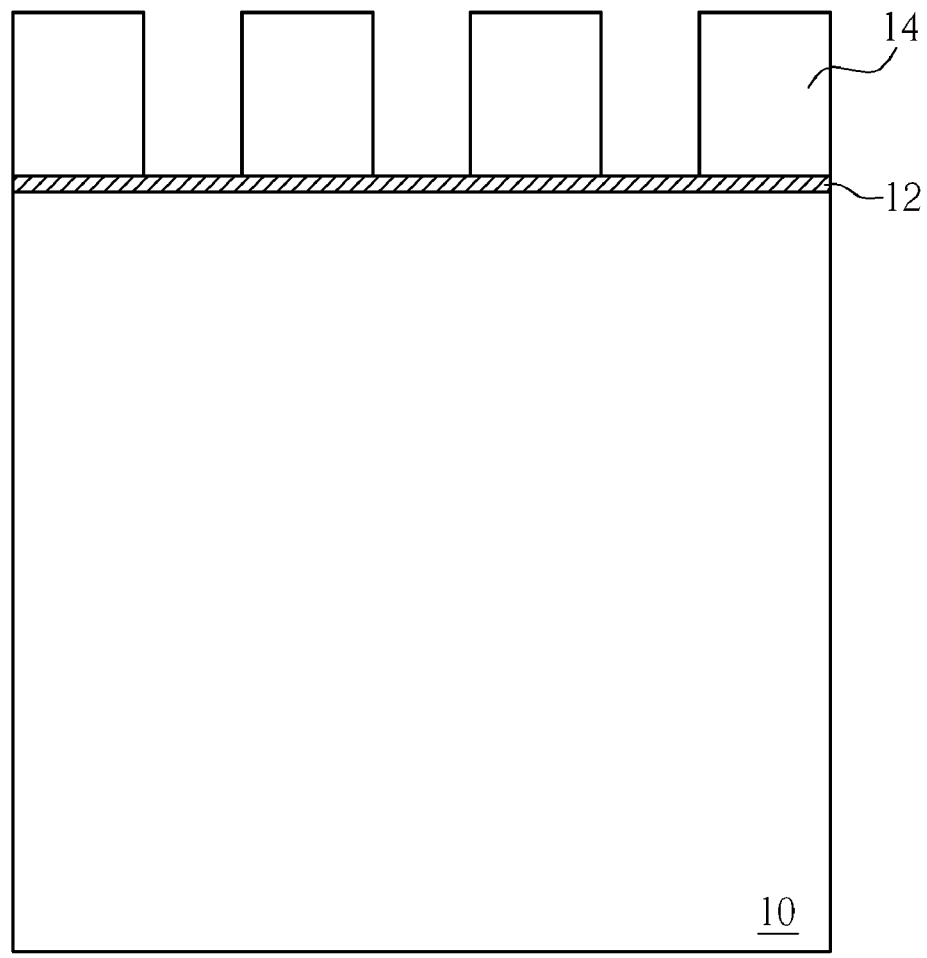
FIG. 1 to FIG. 2 are schematic diagrams showing a conventional method of forming a trench.
Figure 2:
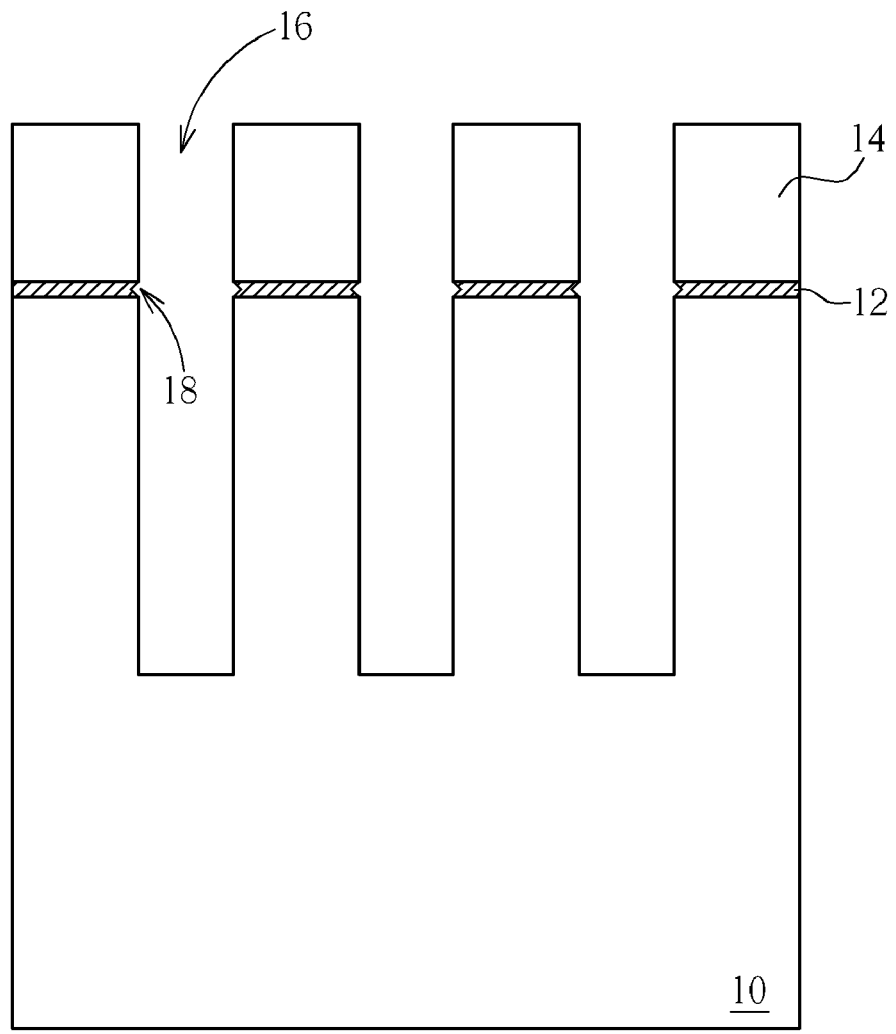

It should be noted that all the figures are diagrammatic. Relative dimensions and proportions of parts of the drawings have been shown exaggerated or reduced in size, for the sake of clarity and convenience in the drawings. The same reference signs are generally used to refer to corresponding or similar features in modified and different embodiments.

DETAILED DESCRIPTION

In the following description, numerous specific details are given to provide a thorough understanding of the invention. However, it will be apparent to one skilled in the art that the invention may be practiced without these specific details. In order to avoid obscuring the present invention, some well-known system configurations and process steps are not disclosed in detail.

Likewise, the drawings showing embodiments of the apparatus are semi-diagrammatic and not to scale and, particularly, some of the dimensions are for the clarity of presentation and are shown exaggerated in the figures. Also, in which multiple embodiments are disclosed and described having some features in common, for clarity and ease of illustration and description thereof, like or similar features will ordinarily be described with like reference numerals.

FIG. 3 to FIG. 9 are schematic diagrams showing a method of forming a trench by a silicon-containing mask.

Figure 3:
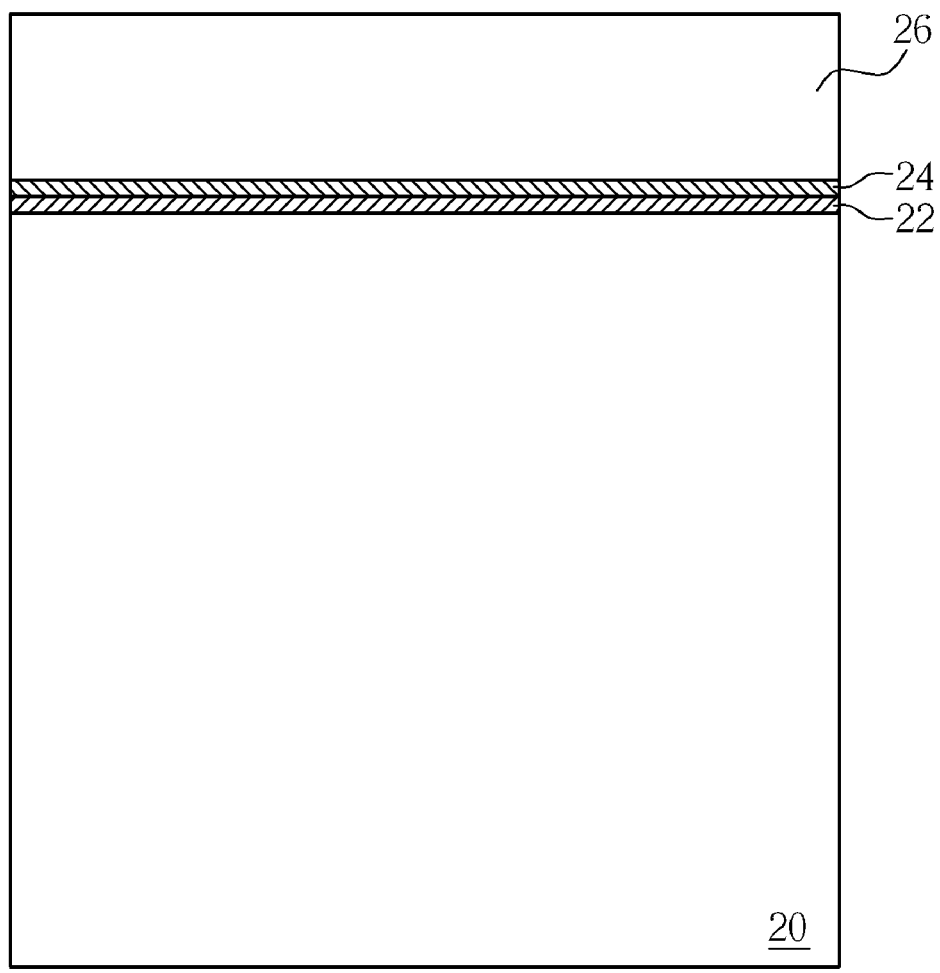
FIG. 3 to FIG. 9 are schematic diagrams showing a method of forming a trench by a silicon-containing mask.
Figure 4:
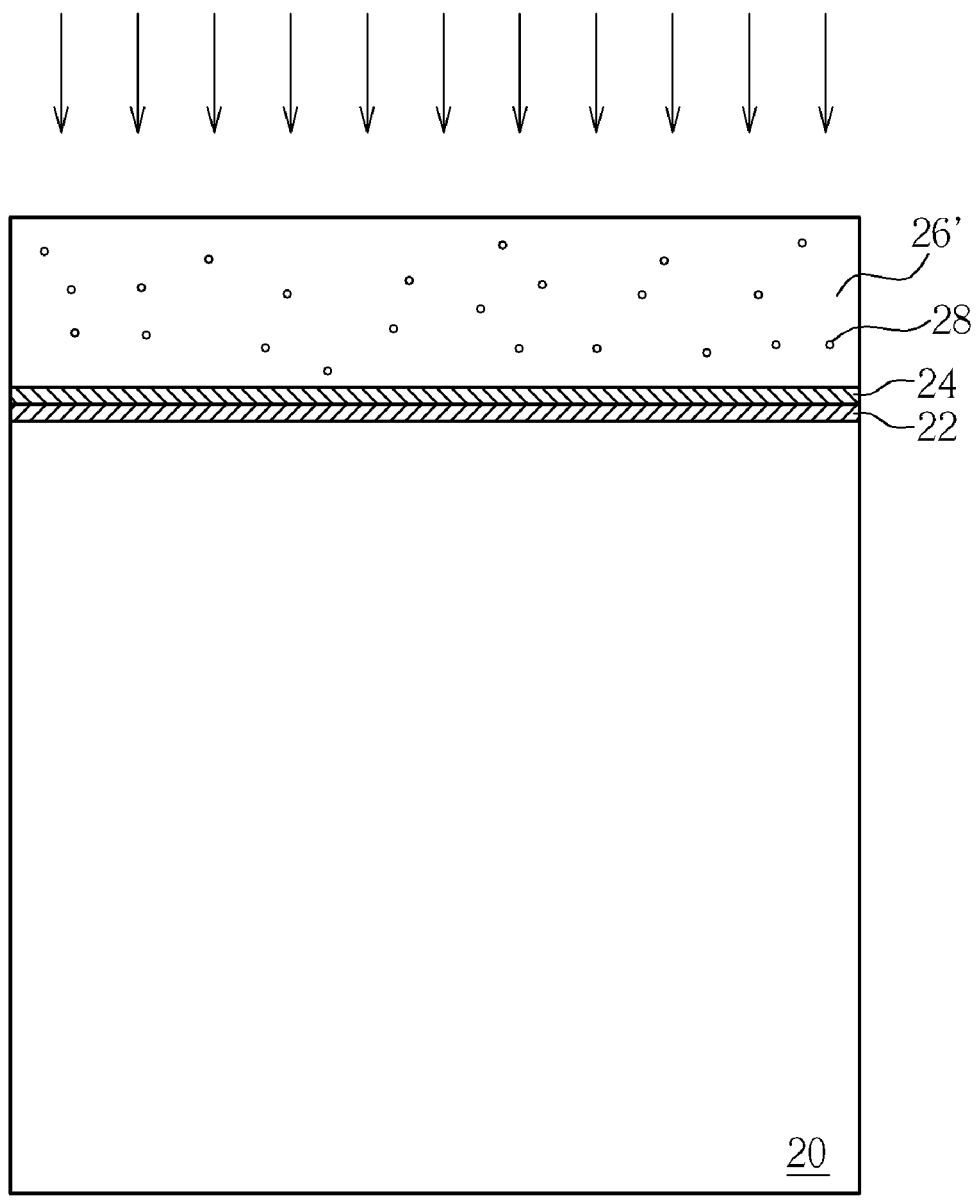

As shown in FIG. 3, a substrate 20 is provided. The substrate 20 is covered by a pad oxide 22, a silicon nitride layer 24 and a silicon-containing mask 26 from bottom to top. The pad oxide 22 and the silicon nitride layer 24 can be omitted optionally based on different product requirements. As shown in FIG. 4, an implantation process is performed to implant anti-etch dopants 28 into the silicon-containing mask 26 so that the silicon-containing mask 26 is transformed into an etching resist mask 26'. The anti-etch dopants includes boron-containing compound such as $BF_2$. The silicon-containing mask 26 includes polysilicon or single crystal silicon. Preferably, the silicon-containing mask 26 is made of polysilicon.

The etching resist mask 26' implanted with anti-etch dopants 28 has higher etch resistibility than the silicon-containing mask 26 has with respect to the same etchant because the anti-etch dopants 28 can increase the etching resistibility. In other words, the etching rate of the etching resist mask 26' becomes lower than the etching rate of the silicon-containing mask 26 with respect to the same etchant.

Figure 5:
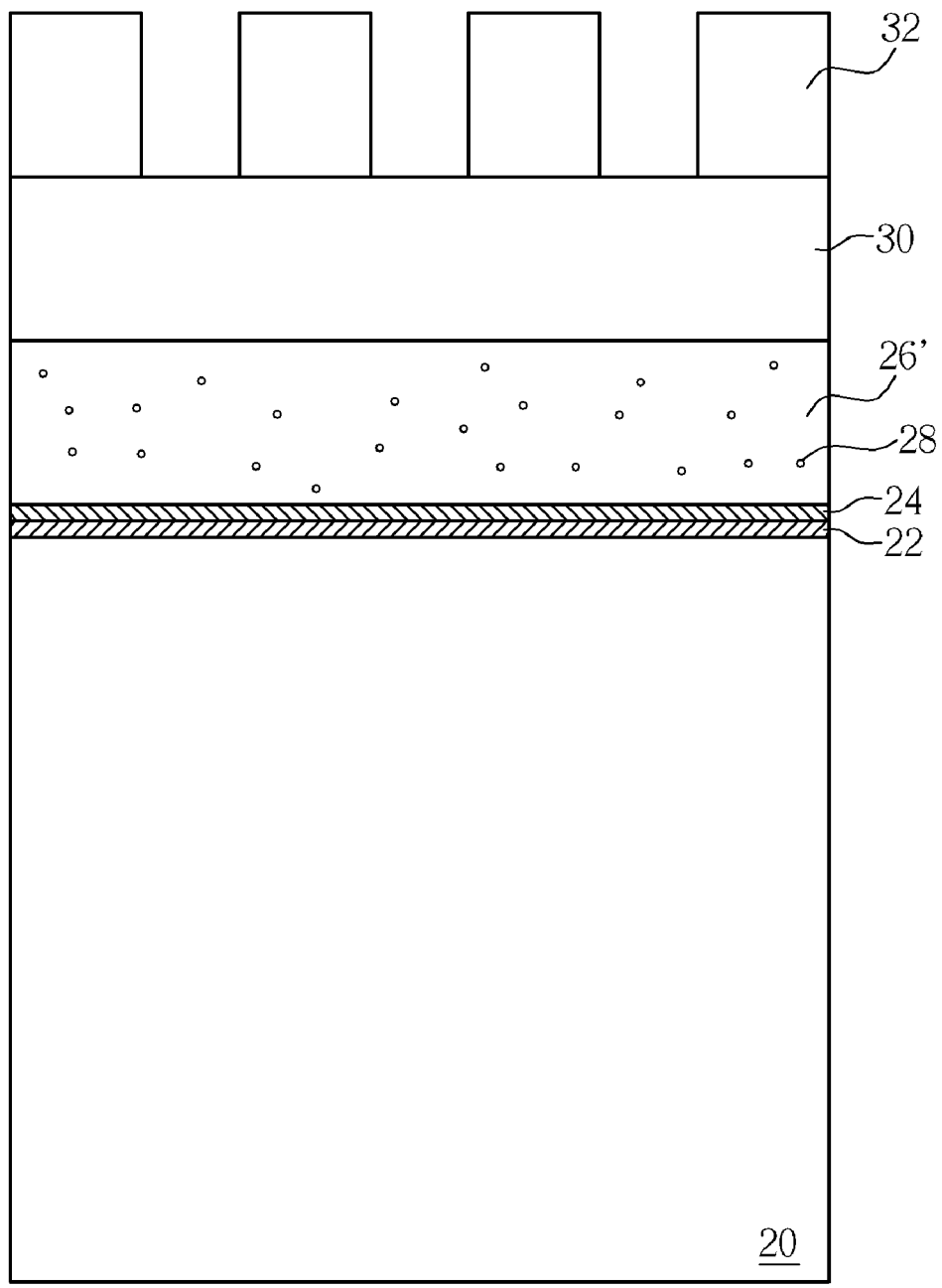
Figure 6:
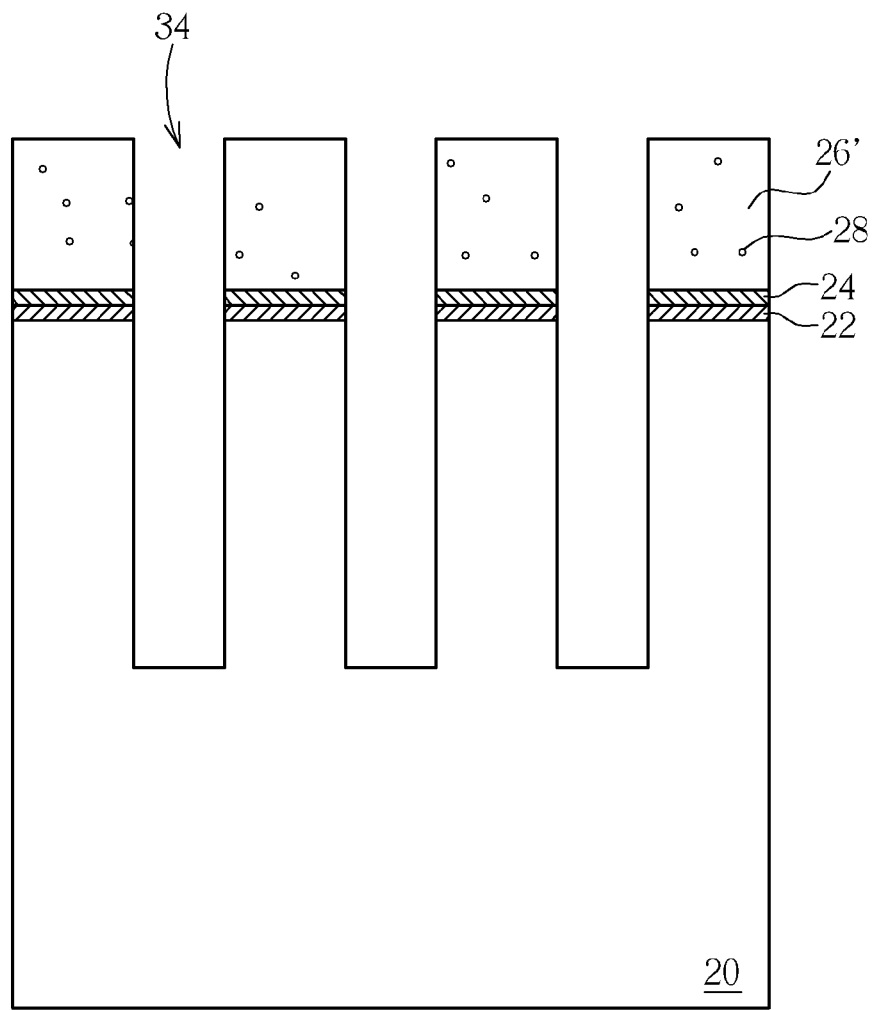

As shown in FIG. 5, a top coat layer 30 is formed on the etching resist mask 26. Later, a patterned photoresist 32 is formed on the top coat layer 30. As shown FIG. 6, the top coat layer 30, the etching resist mask 26', the silicon nitride layer 24, the pad oxide 22 and the substrate 20 are dry etched by taking the patterned photoresist 32 as a mask. Then, numerous trenches 34 are formed in the etching resist mask 26', the silicon nitride layer 24, the pad oxide 22 and the substrate 20. After the dry etch, the top coat layer 30, and the patterned photoresist 32 are both removed.

Figure 7:
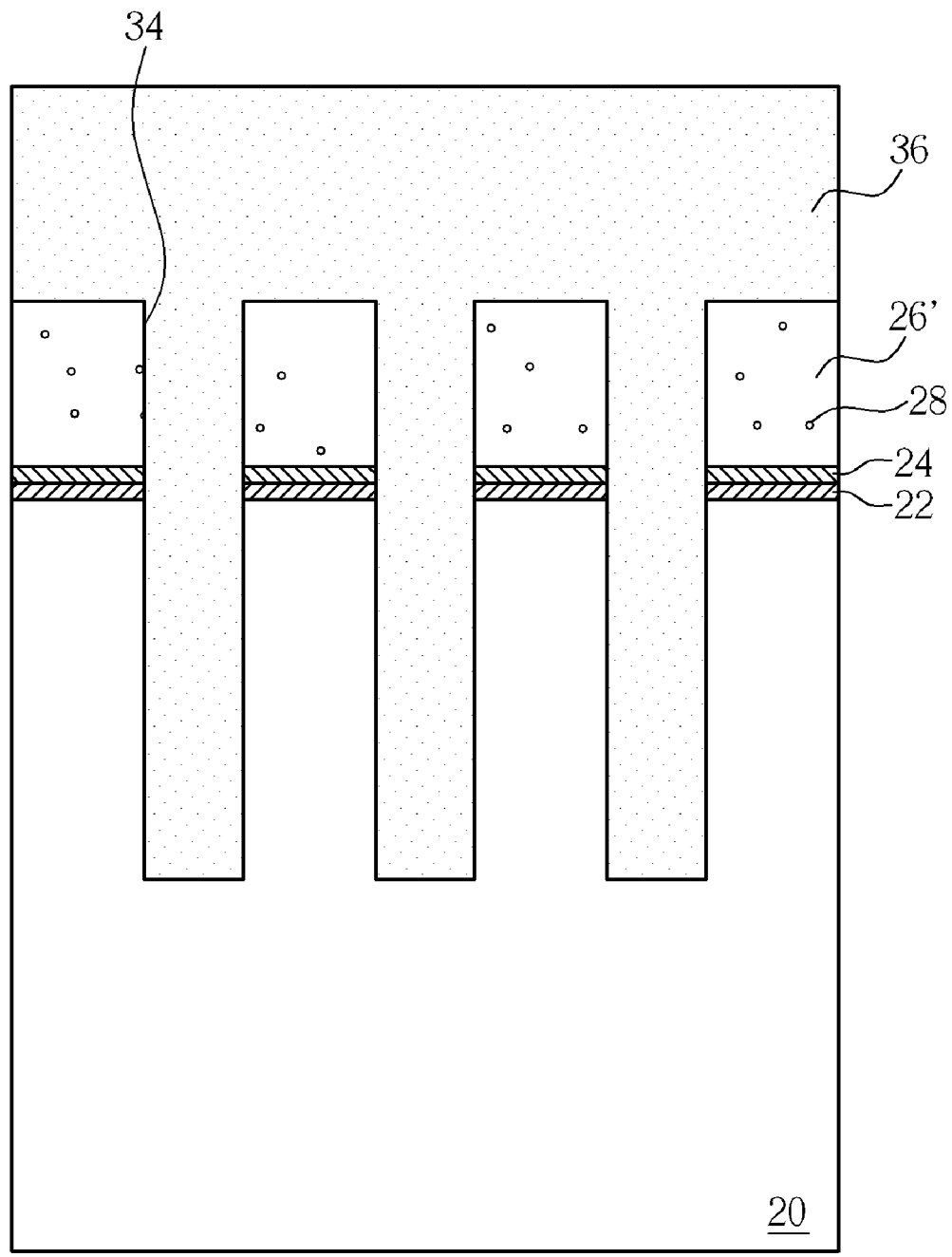

Please refer to FIG. 7, a silicon-containing layer 36 such as polysilicon are formed to fill in the trenches 34 and covers the etching resist mask 26'. The silicon-containing layer 36 may be formed by a deposition process. According to a preferred embodiment of the present invention, the silicon-containing layer 36 and the etching resist mask 26' are substantially made of the same material such as polysilicon. Notably, the etching resist mask 26' contains anti-etch dopants inside so that the etch rate of the etching resist mask 26' is smaller than the etch rate of the silicon-containing layer 36 with respect to the same etchant.

Figure 8:
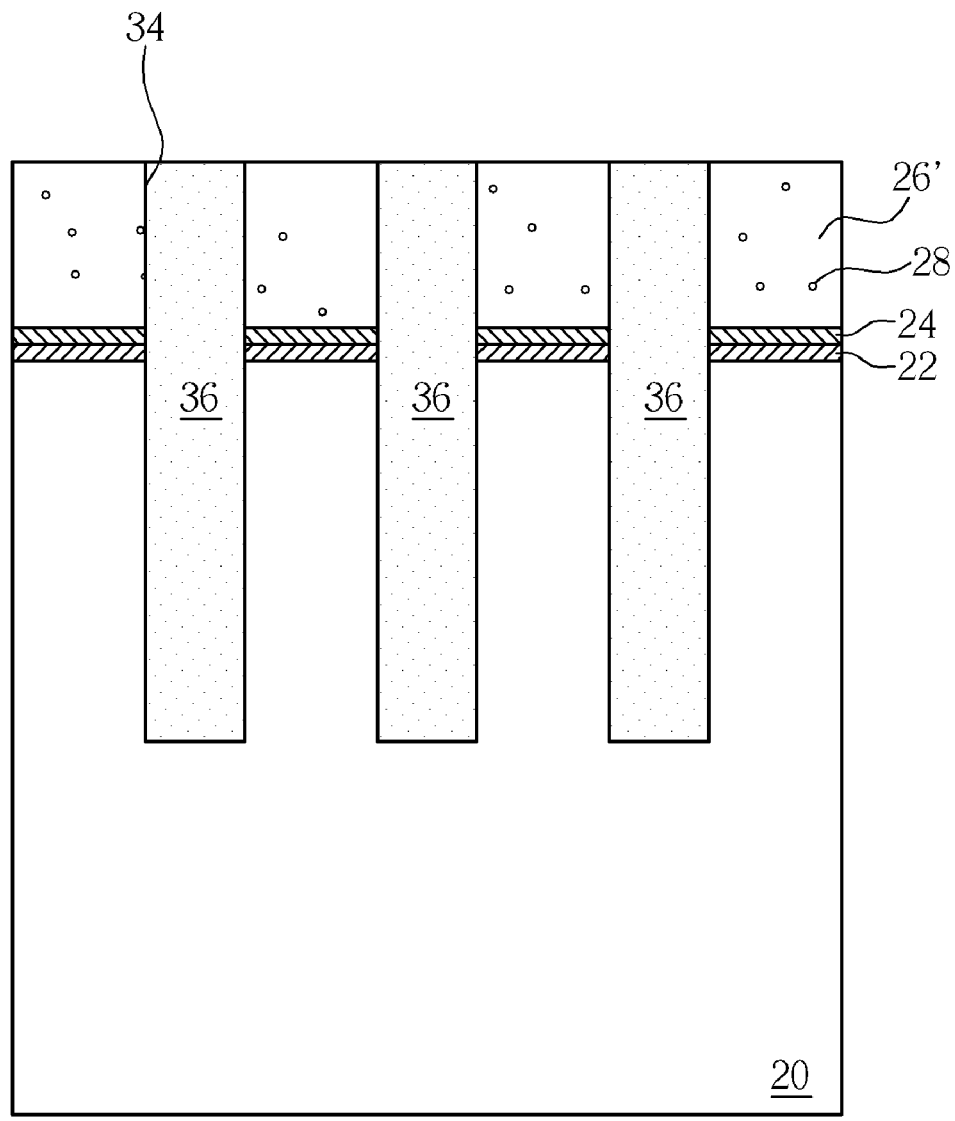
Figure 9:
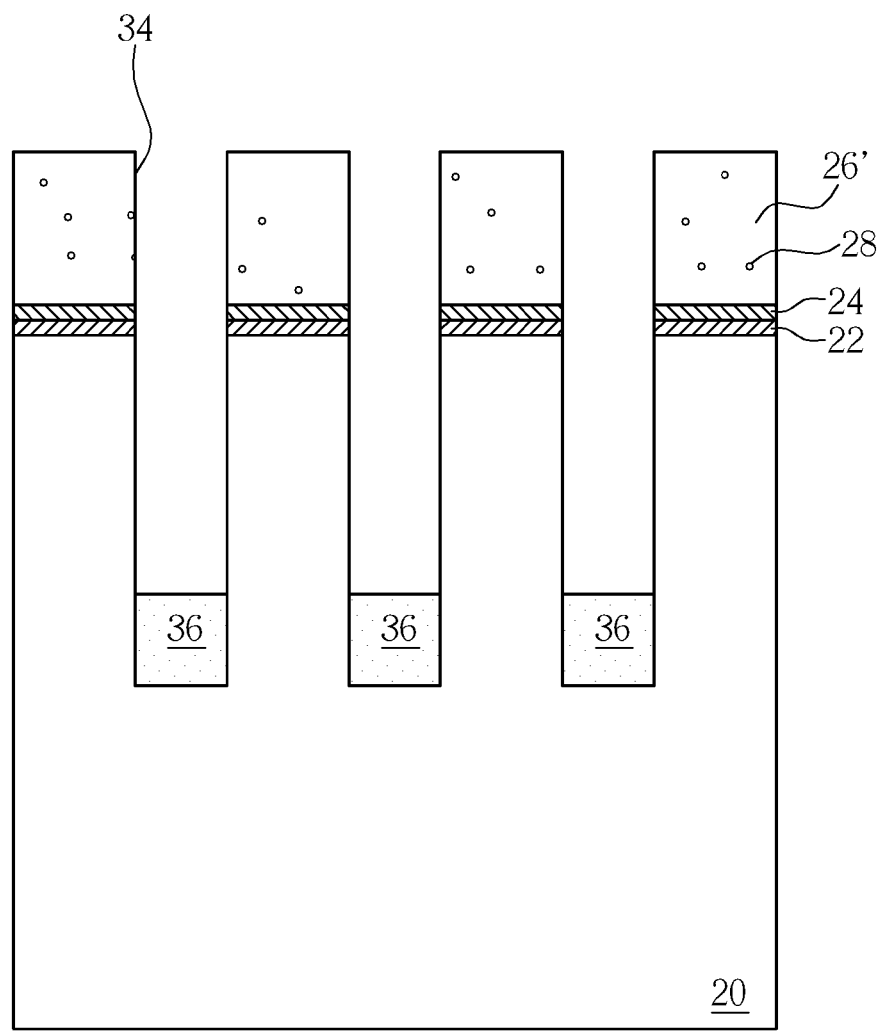

As shown in FIG. 8, the silicon-containing layer 36 is planarized by a chemical mechanical polishing (CMP) process by taking the etching resist mask 26' as a mask. After the CMP process, the silicon-containing layer 36 is aligned with the etching resist mask 26'. As shown in FIG. 9, part of the silicon-containing layer 36 is etched back without damaging the etching resist mask 26'. As mentioned above, the silicon-containing layer 36 and the etching resist mask 26' may be both made of polysilicon. However, they can have discriminate etching resistibility with respect to the same etching. Specifically, the etching resist mask 26' has better etching resistibility than that of the silicon-containing layer 36.

Consequently, only part of the silicon-containing layer 36 in the trenches 34 is removed, and the etching resist mask 26' still remains its integrity. Now, the method of forming a trench by a silicon-containing mask is completed. After that, the trenches can be used to form a trench capacitor, a trench gate, a contact plug or other semiconductor devices.

The present invention utilizes the anti-etch dopants such as $BF_2$ to increase the resistibility of a polysilicon mask. Therefore, in the subsequent process, another polysilicon layer can be etched by taking the polysilicon mask containing anti-etch dopants as a mask. In the end, the polysilicon mask containing anti-etch dopants can remain its integrity.

Those skilled in the art will readily observe that numerous modifications and alterations of the device and method may be made while retaining the teachings of the invention.

What is claimed is:

1. A method of forming a trench by a silicon-containing mask, comprising:
   providing a substrate covered with a silicon mask;
   blanket implanting anti-etch dopants into the silicon mask to transform the silicon mask into an etching resist mask;
   patterning the substrate and the etching resist mask to form at least one trench;
   forming a silicon-containing layer to fill into the trench; and
   etching the silicon-containing layer partly by taking the etching resist mask as a mask.

2. The method of forming a trench by a silicon-containing mask of claim 1, wherein the silicon mask comprises polysilicon.

3. The method of forming a trench by a silicon-containing mask of claim 1, wherein the silicon-containing layer comprises polysilicon.

4. The method of forming a trench by a silicon-containing mask of claim 1, wherein the material of forming the silicon-containing layer is identical to that of the silicon mask.

5. The method of forming a trench by a silicon-containing mask of claim 1, wherein the anti-etch dopants is selected from the group consisting of boron-containing compound.

6. The method of forming a trench by a silicon-containing mask of claim 1, wherein the anti-etch dopants comprises $BF_2$.

7. The method of forming a trench by a silicon-containing mask of claim 1, wherein the substrate and the etching resist mask are patterned by a dry etch process.

\* \* \* \* \*